United States Patent
Yang

(10) Patent No.: US 6,252,527 B1
(45) Date of Patent: Jun. 26, 2001

(54) INTERFACE UNIT FOR SERIAL-TO-PARALLEL CONVERSION AND/OR PARALLEL-TO-SERIAL CONVERSION

(75) Inventor: Yil-Suk Yang, Pohang (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/200,935

(22) Filed: Nov. 30, 1998

(30) Foreign Application Priority Data

Jun. 3, 1998 (KR) .................................................. 98/20619

(51) Int. Cl.⁷ ........................................................ H03M 9/00

(52) U.S. Cl. .......................................... 341/100; 341/101

(58) Field of Search ................................... 341/100, 101; 364/715.01; 395/853

(56) References Cited

U.S. PATENT DOCUMENTS

| | | | | |
|---|---|---|---|---|
| 4,231,084 | * | 10/1980 | Yoshizaki et al. | 364/200 |
| 4,408,272 | * | 10/1983 | Walters | 364/200 |
| 4,502,115 | * | 2/1985 | Eguchi | 364/200 |
| 5,086,388 | * | 2/1992 | Matoba et al. | 395/425 |
| 5,347,523 | * | 9/1994 | Khatri et al. | 371/22.3 |
| 5,502,837 | * | 3/1996 | Hoffert | 395/550 |
| 5,935,237 | * | 10/1999 | Chiba et al. | 712/42 |

OTHER PUBLICATIONS

SH7040 Series (Hardware User Manual), Hitachi, Rev. 2.0 Preliminary, Dec. 9, 1996.

* cited by examiner

Primary Examiner—Peguy JeanPierre

(57) ABSTRACT

A serial communication interface is provided in which the data length operating mode is selectable. Based on the selected data length operating mode, serial-to-parallel and/or parallel-to-serial conversion takes place in data blocks of the selected data length.

34 Claims, 5 Drawing Sheets

INTERFACE UNIT FOR SERIAL-TO-PARALLEL CONVERSION AND/OR PARALLEL-TO-SERIAL CONVERSION

BACKGROUND OF THE INVENTION

1. Field of the Invention

The present invention relates to a communication interface circuit; and more particularly, to a communication interface circuit which permits selection of the amount of data converted from serial-to-parallel and from parallel-to-serial.

2. Description of Related Art

FIG. 1 is a schematic block diagram of a codec interface circuit 1 connected to a conventional serial communication interface circuit 2. As shown, the codec interface circuit 1 and the conventional serial communication interface circuit 2 are disposed on different chips which are then connected together. In FIG. 1, a clock divider 20 receives a master clock signal CLK and an initial count setting SET. The clock divider 20 divides the master clock CLK into a plurality of low frequency clocks. In FIG. 1, the symbol phi represents the master clock CLK, but of a different phase.

A clock source selecting unit 30 receives the plurality of clocks output from the clock divider 20, and based on a selection value stored in a register 32 thereof selects and outputs one of the received clocks. By selecting the plurality of received clocks based on a register value, flexibility exists in setting the system speed. Simply by changing the register value, a designer can alter the system speed.

A frame generating unit 34 receives the selected clock SCLK and converts this clock to an even lower frequency clock SYNC. The selected clock SCLK also clocks a transmit unit 36 and a receive unit 38. As shown, the transmit unit 36 receives a write signal and a read signal. The transmit unit 36 is in parallel communication with a data bus, and has a serial output TXout. The amount of serial data transferred between the data bus and the transmit unit 36 is fixed. Conventionally, the width of the parallel data is fixed at either 8 bits or 16 bits. In the conventional serial communication interface circuit 2 of FIG. 1, the width is shown as 16 bits.

The receive unit 38 also receives the read signal, receives parallel communication from the data bus, and has a serial input RXin. Like the transmit unit 36, the width of the parallel communication received by the receive unit 38 is fixed, and is fixed to the same width as the communication between the data bus and the transmit unit 36.

The operation of the transmit unit 36 and the receive unit 38 will be described in detail below with respect to FIGS. 2 and 3. FIGS. 2 and 3 illustrate circuit diagrams of the transmit unit 36 and the receive unit 38, respectively.

A shown in FIG. 2, the transmit unit 36 includes a first transmit shift register TX1 and a second transmit shift register TX2. Both the first and second transmit shifter registers TX1 and TX2 have the same 8 bit storage capacity, receive the selected clock signal SCLK, receive the read signal, and receive the write signal. The first transmit shift register TX1 is connected to the eight most significant bits of the 16 bit wide data bus, and the second transmit shift register TX2 is connected to the eight least significant bits of the 16 bit wide data bus. The serial input of the first transmit shift register TX1 is connected to ground, and the serial input of the second transmit shift register TX2 is connected to the serial output of the first transmit shift register TX1. The serial output of the second transmit shift register TX2 serves as the output of the transmit unit 36. Typically, both the first and second transmit shift registers TX1 and TX2 are composed of eight 1 bit shift registers connected in series.

When a logic high write signal is received, the first and second transmit shift registers TX1 and TX2 input the parallel data on the data bus. Then, with each pulse of the selected clock SCLK, the first and second transmit shift registers TX1 and TX2 serially shift the data stored therein from their serial inputs to their serial outputs. Accordingly, as the eight bits of parallel data are serially shifted out from the first transmit shift register TX1 to the second transmit shift register TX2, logic level low data is shifted into the first transmit shift register TX1 because the serial input thereof is connected to ground. Meanwhile, as the data stored in the second transmit shift register TX2 is shifted out, the serial data from the first transmit shift register TX1 is shifted in. As the shifting of data out of the second transmit shift register TX1 continues, the serial data from the first transmit shift register TX1 is eventually shifted out of the second transmit shift register TX2. After sixteen pulses of the selected clock SCLK, the parallel data originally input by the first and second transmit shift registers TX1 and TX2 is output as serial data.

When the read signal is logic level low, no parallel input or serial output of data takes place. When the first and second transmit shift registers TX1 and TX2 receive a logic high read signal, the data stored therein is output in parallel to the data bus.

Referring to FIG. 3, the receive unit 38 includes a first receive shift register RX1 and a second receive shift register RX2. Both the first and second receive shift registers RX1 and RX2 have the same 8 bit storage capacity, receive the selected clock signal SCLK, and receive the read signal. The first receive shift register RX1 is connected to the eight most significant bits of the 16 bit wide data bus, and the second receive shift register RX2 is connected to the eight least significant bits of the 16 bit wide data bus. The serial input of the second receive shift register RX2 is connected to the serial output of the first receive shift register RX1. The serial input of the first receive shift register RX1 serves as the serial input for the receive unit 38. Both the write enable inputs of the first and second receive shift registers RX1 and RX2 are disabled by being connected to ground. Typically, both the first and second receive shift registers RX1 and RX2 are composed of eight 1 bit shift registers connected in series.

When a logic high read signal is received, the first and second receive shift registers RX1 and RX2 shift data from their serial inputs to their serial outputs in accordance with the selected clock signal SCLK. Because each of the first and second receive shift registers RX1 and RX2 is eight bits wide, it takes eight pulses of the selected clock signal SCLK for data to transfer across one of the first and second receive shift registers RX1 and RX2. After 16 pulses of the selected clock signal SCLK both the first and second receive shift registers RX1 and RX2 are filled with new serial data. Then, the first and second receive shift registers RX1 and RX2 transfer the data stored therein in parallel to the data bus.

The eight bit serial communication interface has the same structure as the 16 bit serial communication interface described above except that the transfer and receive units in the eight bit serial communication interface include a single transmit shift register and a single receive shift register, respectively.

Depending on the design at issue, an operator must select between using an 8 or 16 bit serial communication interface.

It is desirable, however, for an operator to be able to use a single interface, and then selectively set the interface to either an 8 bit or 16 bit operating mode. Furthermore, while illustrated as two chips, it would also be preferable in terms of improving integration and improving efficiency to place the codec interface circuit and the serial communication interface circuit on a single chip.

SUMMARY OF THE INVENTION

One object of the present invention is to overcome the disadvantages and drawbacks of conventional serial communication interfaces.

Another object of the present invention is to provide a serial communication interface which allows an operator to select between operation in different bit length modes.

A further operation of the present invention is to provide a serial communication interface which also provides the function of a codec interface on the same chip.

These and other objects are achieved by providing a data conversion interface, comprising: a clock signal generator generating a clock signal in response to a mode signal, said mode signal indicating operation in one of at least a first and second data length transfer mode; a serial-to-parallel converter receiving the clock signal, the mode signal and serial data, and converting the serial data into parallel data having a data length as set forth in the mode signal.

These and other objects are further achieved by providing a data conversion interface, comprising: a clock signal generator generating a clock signal in response to a mode signal, said mode signal indicating operation in one of at least a first and second data length transfer mode; and a parallel-to-serial converter receiving the clock signal, the mode signal and parallel data, and converting the parallel data into serial data having a data length as set forth in the mode signal.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of invention.

In the drawings.

DETAILED DESCRIPTION OF THE PREFERRED EMBODIMENTS

Figure 1:
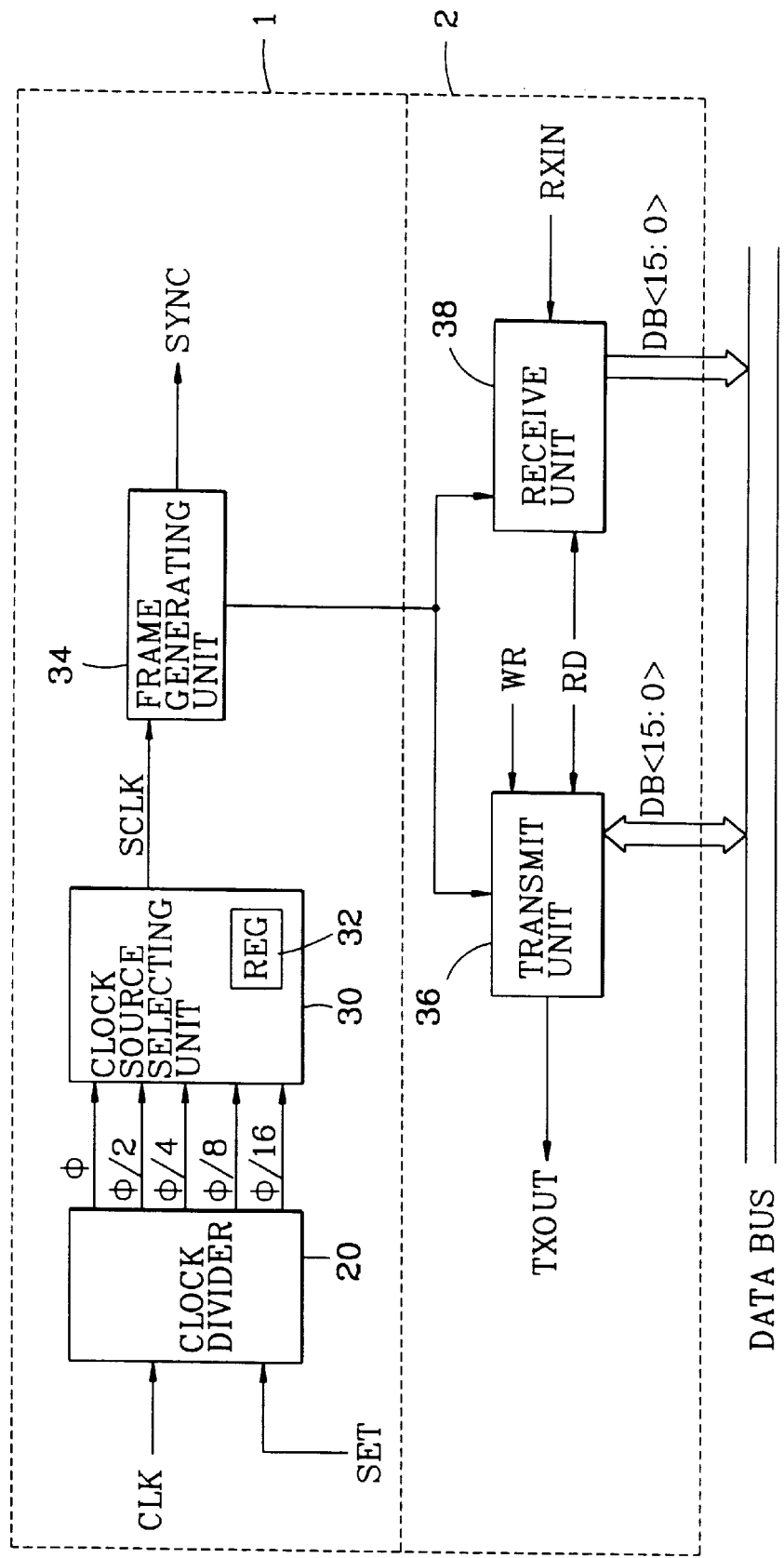
FIG. 1 is a schematic block diagram of a conventional serial communication interface circuit.
Figure 2:
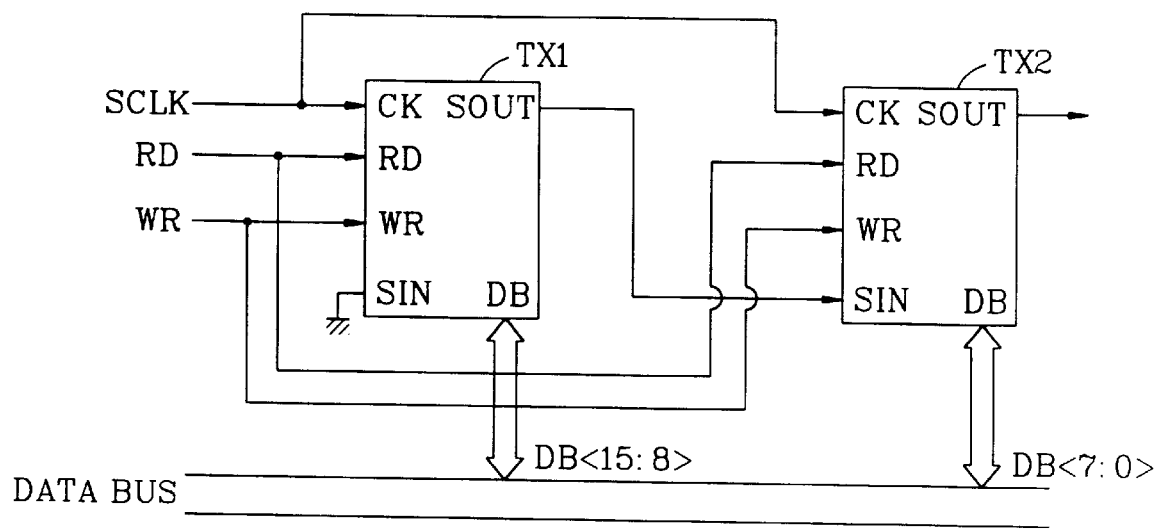
FIG. 2 is a circuit diagram of the transmit unit of FIG. 1.
Figure 3:
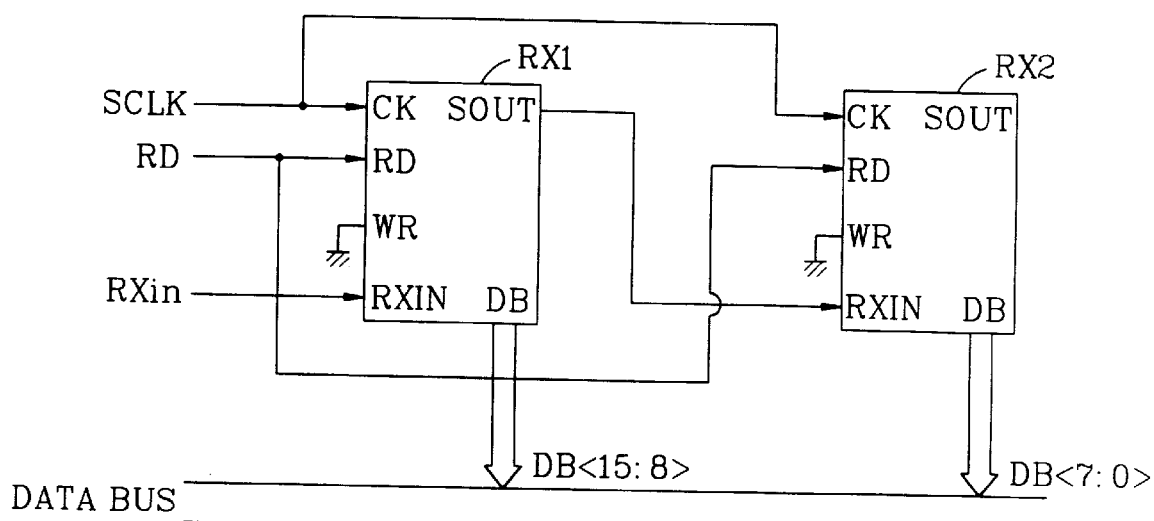
FIG. 3 is a circuit diagram of the receive unit of FIG. 1.
Figure 4:
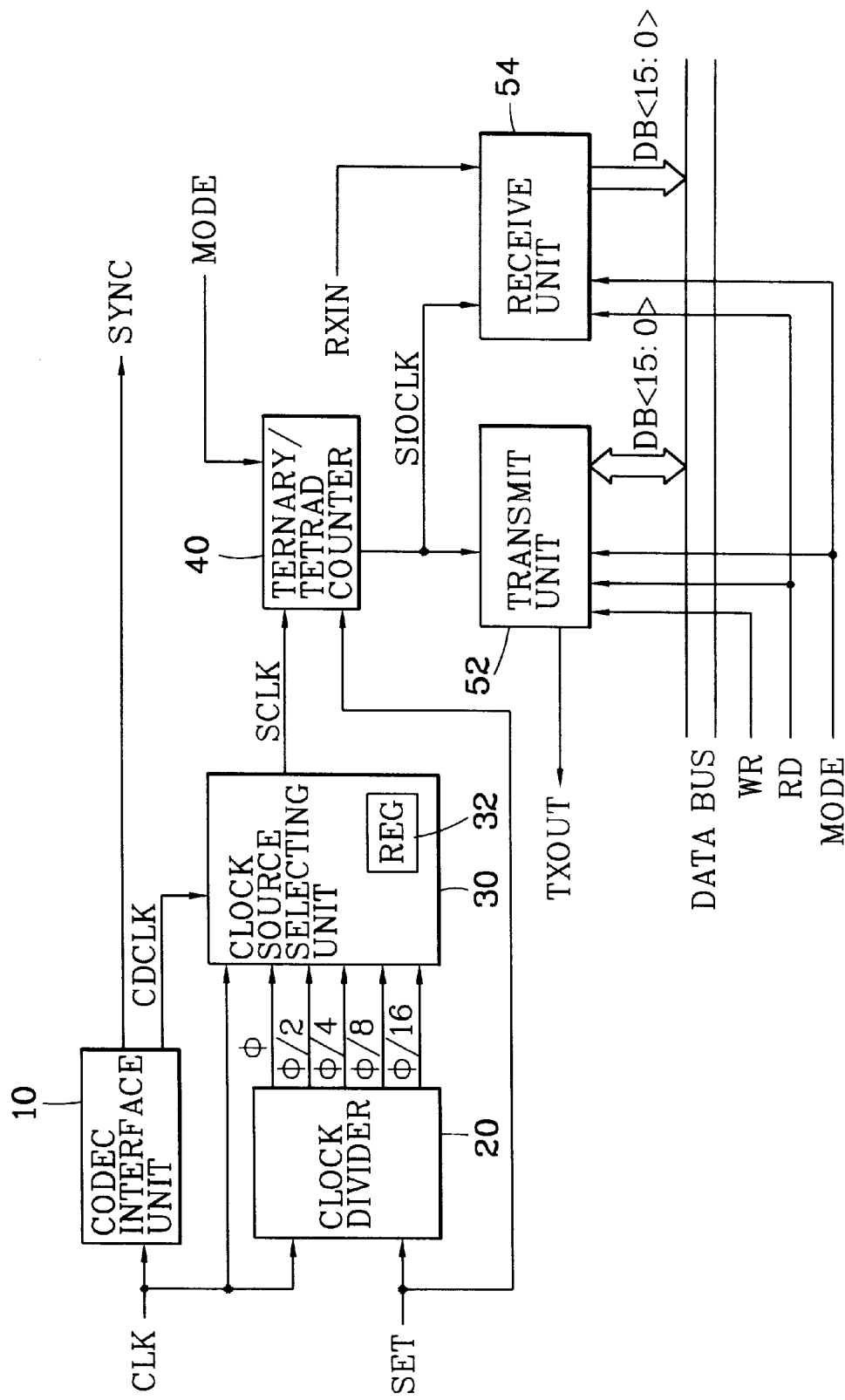
FIG. 4 is a schematic block diagram of an embodiment of a serial communication interface circuit according to the present invention.

FIG. 4 illustrates a schematic block diagram of an embodiment of a serial communication interface according to the present invention. Where the serial communication interface of this embodiment includes the same components as in the conventional serial communication interface of FIG. 1, the same reference numerals have been used to designate those components. Additionally, because of their prior description, the operation of these components will not be described in detail.

Figure 5:
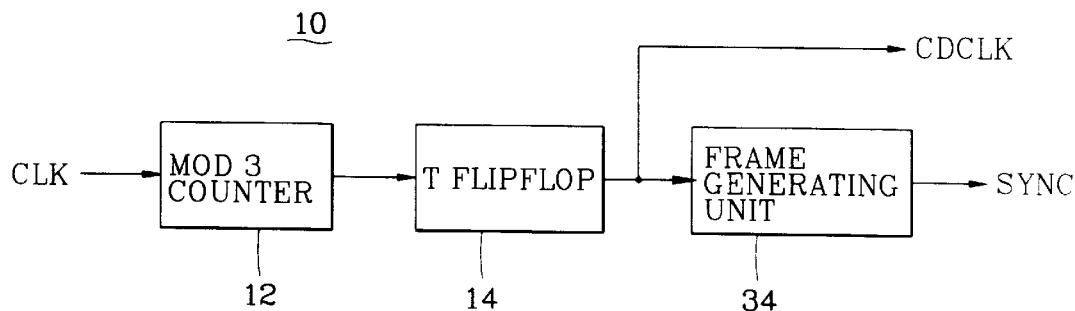
FIG. 5 illustrates the codec interface unit in FIG. 4.

As shown, the serial communication interface of FIG. 4 includes a codec interface unit 10 which receives the master clock CLK and generates the low frequency clock SYNC and an intermediate frequency clock CDCLK. FIG. 5 illustrates the codec interface unit 10 in detail. As shown, the codec interface unit 10 includes a mod 3 counter 12 generating a mod 3 count value in accordance with the master clock signal CLK. A T-type flip flop (T-ff) 14 is triggered to change a logic state of its output on a rising edge of the output from the mod 3 counter 12. Accordingly, the mod 3 counter 12 and the T-FF 14 operate to produce an intermediate frequency clock CDCLK having a frequency less than the master clock CLK. A frame generating unit 34 then generates the low frequency clock SYNC from the intermediate frequency clock CDCLK.

Returning to FIG. 4, a clock divider 20 receives the master clock signal CLK and an initial count setting SET. The clock divider 20 divides the master clock CLK into a plurality of low frequency clocks. In FIG. 4, the symbol phi represents the master clock CLK as before.

A clock source selecting unit 30 receives the plurality of clocks output from the clock divider 20 including the intermediate frequency clock CDCLK output from the codec interface unit 10 and the master clock CLK (note the master clock and the clock labeled phi from the clock divider 20 are the same clock, but have a different phase), and based on a selection value stored in a register 32 thereof selects and outputs one of the received clocks. By selecting the plurality of received clocks based on a register value, flexibility exists in setting the system speed. Simply by changing the register value, a designer can alter the system speed.

A ternary/tetrad counter 40 receives the selected clock SCLK, the set signal SET and a mode signal. The mode signal indicates whether the serial communication interface should operate in an 8 bit mode or a 16 bit mode. When the mode signal indicates operation in the 8 bit mode, the ternary/tetrad counter 40, based on the initial value established by the set signal SET, counts in mod 3 in accordance with the selected clock SCLK. When the mode signal indicates operation in the 16 bit mode, the ternary/tetrad counter 40, based on the initial value established by the set signal SET, counts in mod 4 in accordance with the selected clock SCLK. Accordingly, one skilled in the art will appreciate that the ternary/tetrad counter 40 generates 8 pulses in a predetermined period of time when acting as a mod 3 counter and generates 16 pulses in the same predetermined period of time when acting as a mod 4 counter. The count value output from the ternary/tetrad counter 40 serves as an operation clock SIOCLK for a transmit unit 52 and a receive unit 54.

As further shown in FIG. 4, the transmit unit 52 receives a write signal and a read signal. The transmit unit 52 is in parallel communication with a data bus, and has a serial output TXout. The amount of serial data transferred between the data bus and the transmit unit 52 is not fixed, but is selectable between either 8 bit or 16 bit widths.

The receive unit 54 also outputs the read signal, receives parallel data to the data bus, and has a serial input RXin. Like the transmit unit 52, the width of the parallel communication is not fixed, but is selectable and set at the same width as the communication between the data bus and the transmit unit 52.

Figure 6:
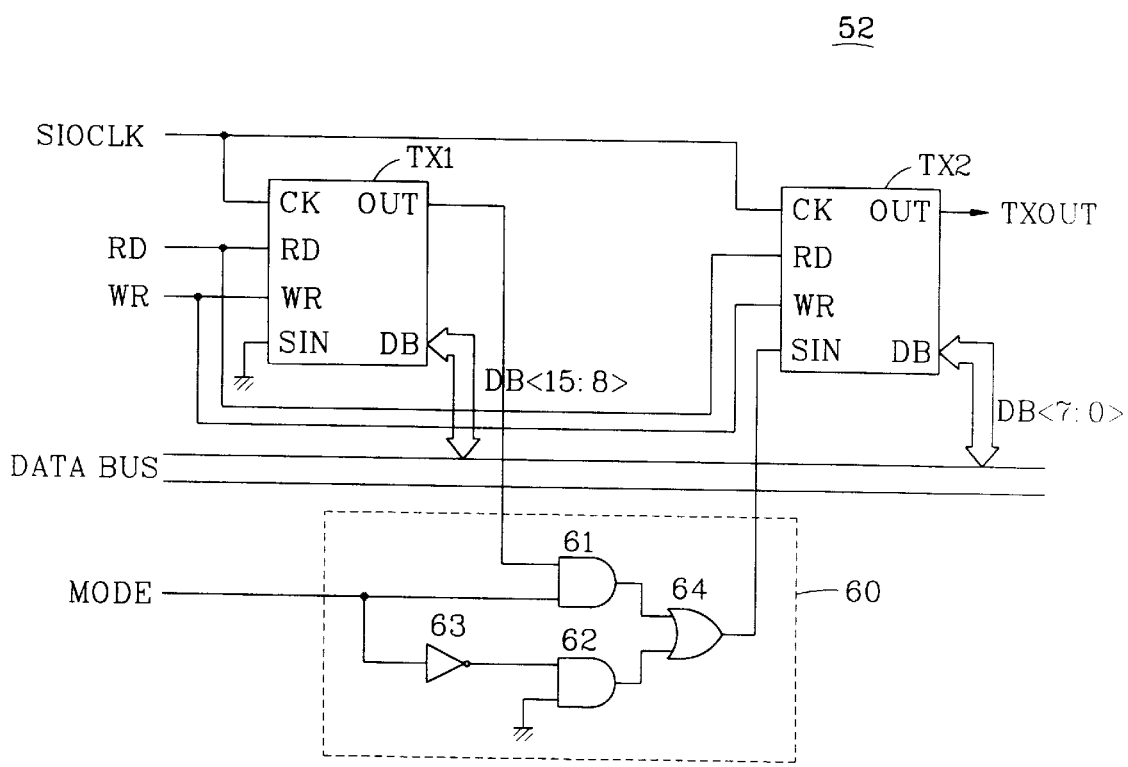
FIG. 6 illustrates the transmit unit of FIG. 4.
Figure 7:
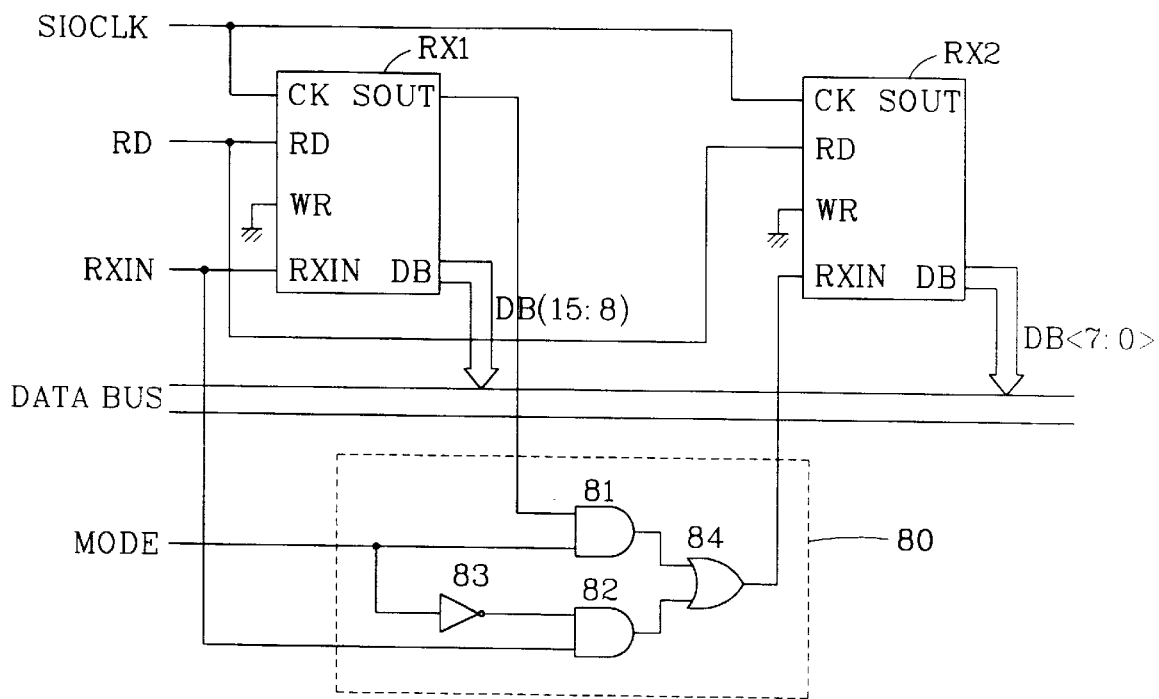
FIG. 7 illustrates the receive unit of FIG. 4.

The operation of the transmit unit 52 and the receive unit 54 will be described in detail below with respect to FIGS. 6 and 7. FIGS. 6 and 7 illustrate circuit diagrams of the transmit unit 52 and the receive unit 54, respectively.

A shown in FIG. 6, the transmit unit 52 includes a first transmit shift register TX1 and a second transmit shift register TX2. Both the first and second transmit shift registers TX1 and TX2 have the same 8 bit storage capacity, receive the operation clock SIOCLK, receive the read signal, and receive the write signal. The first transmit shift register TX1 is connected to the eight most significant bits of the 16 bit wide data bus, and the second transmit shift register TX2 is connected to the eight least significant bits of the 16 bit wide data bus. The serial input of the first transmit shift register TX1 is connected to ground, and the serial input of the second transmit shift register TX2 is connected to the serial output of the first transmit shift register TX1 via a first enable unit 60. The serial output of the second transmit shift register TX2 serves as the output of the transmit shift register 36.

The first enable unit 60 includes a first AND gate 61 receiving the serial output of the first transmit shift register TX1 and the mode signal. A first inverter 63 also receives the mode signal, and a second AND gate 62 receives the output of the first inverter 63 and a ground voltage. A first OR gate 64 receives the output of the first and second AND gates 61 and 62, and the output of the first OR gate 64 is connected to the serial input of the second transmit unit TX2.

When a logic high write signal is received, the first and second transmit shift registers TX1 and TX2 input the parallel data from the data bus. Then, with each pulse of the selected clock, the first and second transmit shift registers TX1 and TX2 serially shift the data stored therein from their serial inputs to their serial outputs. Accordingly, the first AND gate 61 receives the eight bits of parallel data serially shifted out from the first transmit shift register TX1.

Because the second AND gate 62 always receives the logic level low ground signal, its output will always be logic level low. Consequently, the output of the OR gate 64 depends entirely on the output of the first AND gate 61. The mode signal is logic level high when indicating the 16 bit mode of operation, and thus, the output of the second AND gate 61 and the first OR gate 64 is determined by the serial output of the first transmit shift register TX1. Stated another way, in the 16 bit operating mode, the first enable unit 60 transfers the serial data output from the first transmit shift register TX1 to the serial input of the second transmit shift register TX2.

The mode signal, however, is logic low when indicating the 8 bit operating mode. Consequently, the output of the first AND gate 61 will always be logic level low. With the first OR gate 64 receiving logic low inputs from both the first and second AND gates 61 and 62, the output of the first OR gate 64 is continually logic low. Accordingly, in the 8 bit operating mode, the second transmit shift register TX2 shifts in a logic low data stream. A logic level low data stream is shifted into the first transmit shift register TX1, regardless of the operating mode, because the serial input thereof is connected to ground.

From the forgoing description, it is readily apparent that in the 8 bit operating mode, only the parallel data input to the first transmit shift register TX2 is output as serial data because the first enable unit 60 prevents the serial data output from the first transmit shift register TX1 from reaching the serial input of the second transmit shift register TX2. Also, because the ternary/tetrad counter 40 outputs a mod 3 count as the operation clock SIOCLK, during the predetermined period of time between inputting parallel data, the operation clock SIOCLK has 8 pulses; enough to shift the parallel data out of the second transmit shift register TX2.

However, in the 16 bit mode, the ternary tetrad counter 40 outputs a mod 4 count as the operation clock SIOCLK. During the same predetermined period of time, the operation clock SIOCLK has 16 pulses. Because in the 16 bit mode the serial output of the first transmit shift register TX1 is transferred by the first enable unit 60 to the second transmit shift register TX2, the parallel data input by both the first and second transmit shift registers TX1 and TX2 is output during the predetermined period of time.

When the first and second transmit shift register TX1 and TX2 receive a logic high read signal, the data stored therein in is output in parallel to the data bus, and no operation takes place when both the write and read signals are logic low.

Referring to FIG. 7, the receive unit 54 includes a first receive shift register RX1 and a second receive shift register RX2. Both the first and second receive shift registers RX1 and RX2 have the same 8 bit storage capacity, receive the operation clock SIOCLK, and receive the read signal. The first receive shift register RX1 is connected to the eight most significant bits of the 16 bit wide data bus, and the second receive shift register RX2 is connected the eight least significant bits of the 16 bit wide data bus. The serial input of the second receiver shift register RX2 is selectively connected to the serial input or the serial output of the first receive shift register RX1 via a second enable unit 80. The serial input of the first receive shift register RX1 serves as the serial input for the receive unit 54. Both the write enable inputs of the first and second receive shift registers RX1 and RX2 are disabled by being connected to ground.

The second enable unit 80 includes a third AND gate 81 receiving the serial output of the first receive shift register RX1 and the mode signal. A second inverter 83 also receives the mode signal, and a fourth AND gate 82 receives the output of the second inverter 83 and the serial data input to the first receive shift register RX1. A second OR gate 84 receives the outputs of the third and fourth AND gates 81 and 82.

When indicating the 16 bit operating mode, the mode signal is logic level high. The output from the second inverter 83 is logic level low, and as a result, the output of the fourth AND gate 82 is logic level low regardless of the state of the serial data input to the first receive shift register RX1. Therefore, the output of the second OR gate 84 is determined entirely by the output of the third AND gate 81. Because the mode signal is logic level high, the output of the third AND gate 81 is determined by the serial data output from the first receive shift register RX1. Stated another way, in the 16 bit operating mode, the second enable unit 80 transfers the serial data output from the first receive shift register RX1 to the serial input of the second receive shift register RX2.

When indicating the 8 bit operating mode, the mode signal is logic level low, and the output from the third AND gate 81 is logic level low regardless of the state of the data output from the first receive shift register RX1. Accordingly, the output from the second OR gate 84 is determined entirely by the output from the fourth AND gate 82. The output of the second inverter 83 is logic high, and thus, the output of the fourth AND gate 82 is determined entirely by the serial data input to the first receive shift register RX1. Stated another way, in the 8 bit operating mode, the second enable unit 80 transfers the serial data input directly to the serial input of the second receive shift register RX2.

When a logic high read signal is received, the first and second receive shift registers RX1 and RX2 shift data from their serial inputs to their serial outputs in accordance with the selected clock signal. Because each of the first and second receive shift registers RX1 and RX2 is eight bits wide, it take eight pulses of the operation clock signal SIOCLK for data to transfer across one of the first and second receive shift registers RX1 and RX2. In the 8 bit operating mode, after 8 pulses of the operation clock SIOCLK the first and second receive shift registers RX1 and RX2 are filled with the same new serial data. As discussed above, the eight pulses of the operation clock SIOCLK are received during a predetermined period of time. At the end of the predetermined period of time, the data stored in the first and second shift registers RX1 and RX2 is transferred in parallel to the data bus. Because only the lower 8 bits of the data bus are being used in the 8 bit operating mode, the transfer of data to the upper 8 bits of the data bus has no effect.

In the 16 bit operating mode, the first and second receive shift registers RX1 and RX2 receive 16 pulses of the operation clock SIOCLK during the predetermined period of time. As a result, after 16 pulses of the operation clock signal SIOCLK, both the first and second receive shift registers RX1 and RX2 are filled with new serial data. But since the second enable unit 80 transferred the serial output of the first receive shift register RX1 to the serial input of the second receive shift register RX2, the serial data filling each register is different. Then, at the end of the predetermined period of time, the first and second receive shift registers RX1 and RX2 transfer the data stored therein in parallel to the data bus.

When the read signal is low, no operation takes place, and changes in the write signal have no effect on the first and second receive shift registers RX1 and RX2.

As discussed above in detail, the serial communication interface according to the present invention can operate in either an 8 bit serial-to-parallel conversion mode or a 16 bit serial-to-parallel conversion mode, and can operate in either an 8 bit parallel-to-serial conversion mode or a 16 bit parallel-to-serial conversion mode. As one skilled in the art will appreciate, by increasing the number of bits in the mode signal, increasing the width of the data bus and adding receive and transmit shift registers, the number of operating modes can be increased.

Furthermore, while the serial communication interface has been described as connected to a 16 bit wide data bus, the serial communication interface may also be connected to an 8 bit wide data bus.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A data conversion interface, comprising:
   a clock signal generator generating a clock signal in response to a mode signal, said mode signal indicating operation in one of at least a first and second data length transfer mode; and
   a serial-to-parallel converter receiving the clock signal, the mode signal and serial data, and converting the serial data into parallel data having a data length as set forth in the mode signal.

2. The interface of claim 1, wherein the first data length is 8 bits and the second data length is 16 bits.

3. The interface of claim 2, wherein the clock signal generator generates a mod 3 clock signal when the mode signal indicates the first data length and generates a mod 4 clock signal when the mode signal indicates the second data length.

4. The interface of claim 1, wherein the clock signal generator generates a mod 3 clock signal when the mode signal indicates the first data length and generates a mod 4 clock signal when the mode signal indicates the second data length.

5. The interface of claim 1, wherein the serial-to parallel converter comprises:
   a first transfer unit having a first storage capacity equal to said first data length, storing a first portion of the serial data and converting the stored first portion of the serial data into parallel data of the first data length;
   a second transfer unit having a second storage capacity, a total of the first and second storage capacities equaling the second data length, the second transfer unit storing a second portion of the serial data and converting the stored second portion of the serial data to parallel data of a length equal to the second storage capacity.

6. The interface of claim 5, wherein the serial-to-parallel converter further comprises:
   an enabling control circuit controlling whether the second portion of the serial data is one of same as and different from the first portion of the serial data based on the mode signal.

7. The interface of claim 6, wherein the enabling control circuit controls the input of serial data to the second transfer unit such that when the mode signal indicates the first data length transfer mode, the second portion of the serial data is the same as the first portion of the serial data, and when the mode signal indicates the second data length transfer mode, the second portion of the serial data is different from the first portion of the serial data.

8. The interface of claim 5, wherein
   the first transfer unit includes a first shift register having a length equal to the first data length, and shifts the serial data through the first shift register in response to the clock signal, and outputs the serial data stored in the first shift register in parallel at a predetermined interval;
   the second transfer unit includes a second shift register having a length equal to the second data length minus the first data length, in a first state the second transfer unit shifts the serial data output from the first shift register through the second shift register in response to the clock signal, in a second state the second transfer unit shifts the serial data input to the first shift register through the second shift register, and the second transfer unit outputs the serial data stored in the second shift register in parallel at the predetermined interval; and
   a state control unit controlling a state of the second transfer unit based on the mode signal.

9. The interface of claim 8, wherein the state control unit receives the serial data output from the first shift register, prevents the serial data output from the first shift register from being input to the second shift register when the mode signal indicates the first data length transfer mode, receives the serial data input to the first shift register, and supplies the serial data input to the first shift register to a serial input of the second shift register when the mode signal indicates the first data length transfer mode.

10. The interface of claim 9, wherein the state control unit supplies the serial data output from the first shift register to the serial input of the second shift register when the mode signal indicates the second data length transfer mode, and prevents the serial data input to the first shift register from being input by the second shift register when the mode signal indicates the second data length transfer mode.

11. The interface of claim 8, wherein the state control unit receives the serial data output from the first shift register, supplies the serial data output from the first shift register to a serial input of the second shift register when the mode signal indicates the second data length transfer mode, receives the serial data input to the first shift register, and prevents the serial data input to the first shift register from being input by the second shift register when the mode signal indicates the second data length transfer mode.

12. The interface of claim 8, wherein the enable control circuit comprises:
   a first AND gate receiving the serial data output from the first shift register and the mode signal;
   an inverter inverting the mode signal;
   a second AND gate receiving output from the inverter and the serial data input to the first shift register; and
   an OR gate receiving output from the first and second AND gates, and an output of the OR gate connected to a serial input of the second shift register.

13. The interface of claim 8, wherein the clock generator generates the clock signal to have a first number of pulses during the predetermined interval when the mode signal indicates the first data length transfer mode, and generates the clock signal to have a second number of pulses during the predetermined interval when the mode signal indicates the second data length transfer mode.

14. The interface of claim 13, wherein the first number of pulses equals the first data length and the second number of pulses equals the second data length.

15. The interface of claim 5, wherein
   the first transfer unit performs the serial-to-parallel conversion operation based on a read signal; and
   the second transfer unit performs the serial-to-parallel conversion operation based on the read signal and output from the enable control unit.

16. The interface of claim 1, wherein the amount of time spent converting the serial data into parallel data for both the first and second data lengths is constant.

17. A data conversion interface, comprising:
   a clock signal generator generating a clock signal in response to a mode signal, said mode signal indicating operation in one of at least a first and second data length transfer mode; and
   a parallel-to-serial converter receiving the clock signal, the mode signal and parallel data, and converting the parallel data into serial data having a data length as set forth in the mode signal.

18. The interface of claim 17, wherein the first data length is 8 bits and the second data length is 16 bits.

19. The interface of claim 18, wherein the clock signal generator generates a mod 3 clock signal when the mode signal indicates the first data length and generates a mod 4 clock signal when the mode signal indicates the second data length.

20. The interface of claim 17, wherein the clock signal generator generates a mod 3 clock signal when the mode signal indicates the first data length and generates a mod 4 clock signal when the mode signal indicates the second data length.

21. The interface of claim 17, wherein the parallel-to-serial converter comprises:
   a first transfer unit having a first storage capacity equal to said first data length, storing a least significant bits portion of the parallel data, the least significant bits portion having a width equal to the first data length, and outputting the stored least significant bits portion as serial data;
   a second transfer unit having a second storage capacity, a total of the first and second storage capacities equaling the second data length, the second transfer unit storing a next most significant bits portion of the parallel data, the next most significant bits portion having a width equal to the second storage capacity, and outputting the next most significant bits portion as serial data; and
   transfer control unit controlling whether the serial data output from the second transfer unit is output from the parallel-to-serial converter based on the mode signal.

22. The interface of claim 21, wherein
   the first transfer unit includes a first shift register having a length equal to the first data length, the first transfer unit inputs the least significant bits portion into the first shift register at a predetermined interval and shifts the least significant bits portion out of the first register as serial data in response to the clock signal;
   the second transfer unit includes a second shift register having a length equal to the second data length minus the first data length, the second transfer unit inputs the next significant bits portion into the second shift register at the predetermined interval, and shifts the next significant bits portion out of the second shift register as serial data in response to the clock signal; and
   the transfer control unit controls whether the serial data output from the second shift register is supplied to a serial input of the first shift register.

23. The interface of claim 22, wherein the transfer control unit receives the serial data output from the second shift register, and prevents the serial data output from second first shift register from being input to the first shift register when the mode signal indicates the first data length transfer mode.

24. The interface of claim 23, wherein the transfer control unit permits the serial data output from the second shift register to be input by the first shift register when the mode signal indicates the second data length transfer mode.

25. The interface of claim 24, wherein the transfer control unit comprises:
   a first AND gate receiving the serial data output from the second shift register and the mode signal;
   an inverter inverting the mode signal;
   a second AND gate receiving output from the inverter and a logic level 0 voltage; and
   an OR gate receiving output from the first and second AND gates, and an output of the OR gate connected to a serial input of the first shift register.

26. The interface of claim 23, wherein the transfer control unit supplies a first logic state to a serial input of the first shift register when the mode signal indicates the first data length transfer operation.

27. The interface of claim 22, wherein the clock generator generates the clock signal to have a first number of pulses during the predetermined interval when the mode signal indicates the first data length transfer mode, and generates the clock signal to have a second number of pulses during the predetermined interval when the mode signal indicates the second data length transfer mode.

28. The interface of claim 27, wherein the first number of pulses equals the first data length and the second number of pulses equals the second data length.

29. The interface of claim 21, wherein
   the first transfer unit performs the parallel-to-serial conversion operation based on a write signal; and the second transfer unit performs the parallel-to-serial conversion operation based on the write signal and output from the transfer control unit.

30. The interface of claim 29, wherein
the serial-to parallel converter includes,
- a first transfer unit having a first storage capacity equal to said first data length, storing a first portion of the serial data and converting the stored first portion of the serial data into parallel data of the first data length,
- a second transfer unit having a second storage capacity, a total of the first and second storage capacities equaling the second data length, the second transfer unit storing a second portion of the serial data and converting the stored second portion of the serial data to parallel data of a length equal to the second storage capacity, and
- an enabling control circuit controlling whether the second portion of the serial data is one of same as and different from the first portion of the serial data based on the mode signal; and the parallel-to-serial converter includes,
- a third transfer unit having a third storage capacity equal to said first data length, storing a least significant bits portion of the parallel data, the least significant bits portion having a width equal to the first data length, and outputting the stored least significant bits portion as serial data,
- a fourth transfer unit having a fourth storage capacity, a total of the third and fourth storage capacities equaling the second data length, the fourth transfer unit storing a next most significant bits portion of the parallel data, the next most significant bits portion having a width equal to the fourth storage capacity, and outputting the next most significant bits portion as serial data, and
- transfer control unit controlling whether the serial data output from the fourth transfer unit is output from the parallel-to-serial converter based on the mode signal.

31. The interface of claim 30, wherein
the first transfer unit includes a first shift register having a length equal to the first data length, and shifts the serial data through the first shift register in response to the clock signal, and outputs the serial data stored in the first shift register in parallel at a predetermined interval;

the second transfer unit includes a second shift register having a length equal to the second data length minus the first data length, in a first state the second transfer unit shifts the serial data output from the first shift register through the second shift register in response to the clock signal, in a second state the second transfer unit shifts the serial data input to the first shift register through the second shift register, and the second transfer unit outputs the serial data stored in the second shift register in parallel at the predetermined interval;

a state control unit controlling a state of the second transfer unit based on the mode signal;

the third transfer unit includes a third shift register having a length equal to the first data length, the third transfer unit inputs the least significant bits portion into the third shift register at a predetermined interval and shifts the least significant bits portion out of the third shift register as serial data in response to the clock signal;

the fourth transfer unit includes a fourth shift register having a length equal to the second data length minus the first data length, the fourth transfer unit inputs the next significant bits portion into the fourth shift register at the predetermined interval, and shifts the next significant bits portion out of the fourth shift register as serial data in response to the clock signal; and the transfer control unit controls whether the serial data output from the fourth shift register is supplied to a serial input of the third shift register.

32. The interface of claim 17, wherein the parallel-to-serial converter temporarily stores the parallel data, and outputs the parallel data in serial in response to a write signal, and output the parallel data in parallel in response to a read signal.

33. The interface of claim 17, further comprising:
a serial-to-parallel converter receiving the clock signal, the mode signal and serial data, and converting the serial data into parallel data having a data length as set forth in the mode signal.

34. The interface of claim 17, wherein the amount of time spent converting the parallel data into serial data for both the first and second data lengths is constant.

* * * * *

(12) EX PARTE REEXAMINATION CERTIFICATE (8922nd)
United States Patent
Yang

(10) Number: US 6,252,527 C1
(45) Certificate Issued: Mar. 27, 2012

(54) INTERFACE UNIT FOR SERIAL-TO-PARALLEL CONVERSION AND/OR PARALLEL-TO-SERIAL CONVERSION

(75) Inventor: Yil-Suk Yang, Pohang (KR)

(73) Assignee: Intellectual Ventures II LLC, Wilmington, DE (US)

Reexamination Request:
No. 90/011,508, Feb. 25, 2011

Reexamination Certificate for:
Patent No.: 6,252,527
Issued: Jun. 26, 2001
Appl. No.: 09/200,935
Filed: Nov. 30, 1998

(30) Foreign Application Priority Data

Jun. 3, 1998 (KR) .............................. 98/20619

(51) Int. Cl.
*H03M 9/00* (2006.01)
(52) U.S. Cl. ......................................... 341/100; 341/101
(58) Field of Classification Search ........................ None
See application file for complete search history.

(56) References Cited

To view the complete listing of prior art documents cited during the proceeding for Reexamination Control Number 90/011,508, please refer to the USPTO's public Patent Application Information Retrieval (PAIR) system under the Display References tab.

*Primary Examiner* — Kenneth J Whittington

(57) ABSTRACT

A serial communication interface is provided in which the data length operating mode is selectable. Based on the selected data length operating mode, serial-to-parallel and/or parallel-to-serial conversion takes place in data blocks of the selected data length.

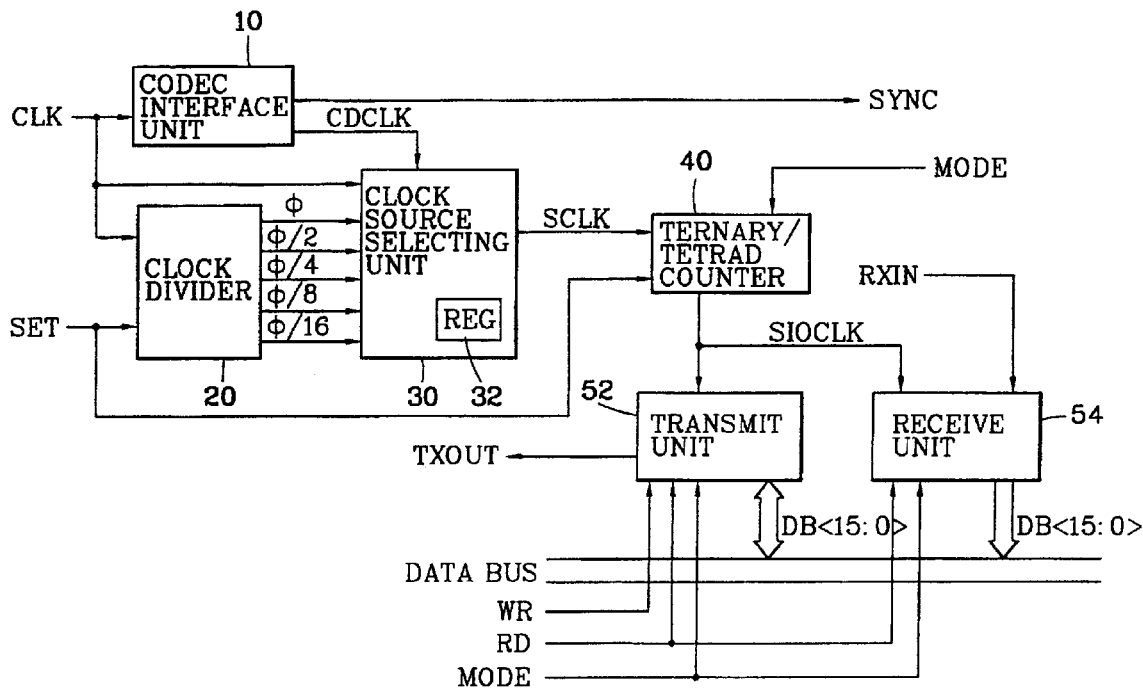

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-5, 15, 18-22, 27, 33 is confirmed.

Claim 17 is cancelled.

Claims 8, 23, 29-32 are determined to be patentable as amended.

New claims 35-37 are added and determined to be patentable.

Claims 6, 7, 9-14, 16, 24-26, 28, 34 were not reexamined.

8. The interface of claim 5, wherein
the first transfer unit includes a first shift register having a length equal to the first data length, and shifts the serial data through the first shift register in response to the clock signal, and outputs the serial data stored in the first shift register in parallel at a predetermined interval;
the second transfer unit includes a second shift register having a length equal to the second data length minus the first data length, in a first state the second transfer unit shifts the serial data output from the first shift register through the second shift register in response to the clock signal, in a second state the second transfer unit shifts the serial data input to the first shift register through the second shift register, and the second transfer unit outputs the serial data stored in the second shift register in parallel at the predetermined interval; and
*the interface further comprises* a state control unit controlling a state of the second transfer unit based on the mode signal.

23. The interface of claim 22, wherein the transfer control unit receives the serial data output from the second shift register, and prevents the serial data output from the second [first] shift register from being input to the first shift register when the mode signal indicates the first data length transfer mode.

29. The interface of claim 21, wherein
The [first] *second* transfer unit performs the parallel-to-serial conversion operation based on a write signal; and
The [second] *first* transfer unit performs the parallel-to-serial conversion operation based on the write signal and output from the transfer control unit.

30. The interface of claim [29] *17*, wherein [the] *the interface further includes a* serial-to-parallel converter [includes,] *comprising:*
a first transfer unit having a first storage capacity equal to said first data length, storing a first portion of the serial data and converting the stored first portion of the serial data into parallel data of the first data length,
a second transfer unit having a second storage capacity, a total of the first and second storage capacities equaling the second data length, the second transfer unit storing a second portion of the serial data and converting the stored second portion of the serial data to parallel data of a length equal to the second storage capacity, and
an enabling control circuit controlling whether the second portion of the serial data is one of same as and different from the first portion of the serial data based on the mode signal; and
the parallel-to-serial converter includes[.]*:*
a third transfer unit having a third storage capacity equal to said first data length, storing a least significant bits portion of the parallel data, the least significant bits portion having a width equal to the first data length, and outputting the stored least significant bits portion as serial data,
a fourth transfer unit having a fourth storage capacity, a total of the third and fourth storage capacities equaling the second data length, the fourth transfer unit storing a next most significant bits portion of the parallel data, the next most significant bits portion having a width equal to the fourth storage capacity, and outputting the next most significant bits portion as serial data, and
transfer control unit controlling whether the serial data output from the fourth transfer unit is output from the parallel-to-serial converter based on the mode signal.

31. The interface of claim 30, wherein
the first transfer unit includes a first shift register having a length equal to the first data length, and shifts the serial data through the first shift register in response to the clock signal, and outputs the serial data stored in the first shift register [in parallel] at a predetermined interval;
the second transfer unit includes a second shift register having a length equal to the second data length minus the first data length, in a first state the second transfer unit shifts the serial data output from the first shift register through the second shift register in response to the clock signal, in a second state the second transfer unit shifts the serial data input to the first shift register through the second shift register, and the second transfer unit outputs the serial data stored in the second shift register [in parallel] at the predetermined interval;
[a state control unit controlling] *the enabling control circuit controls* a state of the [second] *first* transfer unit based on the mode signal;
the third transfer unit includes a third shift register having a length equal to the first data length, the third transfer unit inputs the least significant bits portion into the third shift register at a predetermined interval and shifts the least significant bits portion out of the third shift register [as serial data] in response to the clock signal;
the fourth transfer unit includes a fourth shift register having a length equal to the second data length minus the first data length, the fourth transfer unit inputs the next significant bits portion into the fourth shift register at the predetermined interval, and shifts the next significant bits portion out of the fourth shift register as serial data in response to the clock signal; and
the transfer control unit controls whether the serial data output from the fourth shift register is supplied to a serial input of the third shift register.

32. The interface of claim 17, wherein the parallel-to-serial converter temporarily stores the parallel data, and outputs the parallel data in serial in response to a write signal, and [output] *outputs* the parallel data in parallel in response to a read signal.

35. *A data conversion interface, comprising:*

*a clock signal generator generating a clock signal in response to a mode signal, said mode signal indicating operation in one of at least a first and second data length transfer mode, wherein at least one of the data lengths is 16 bits; and*

*a parallel-to-serial converter receiving the clock signal, the mode signal, and parallel data and converting the parallel data into serial data having a data length as set forth in the mode signal.*

36. *A data conversion interface, comprising:*

*a clock signal generator generating a clock signal in response to a mode signal, said mode signal indicating operation in one of at least a first and second data length transfer mode; and*

*a linear shift register-type parallel-to-serial converter receiving the clock signal, the mode signal, and parallel data and converting the parallel data into serial data having a data length as set forth in the mode signal.*

37. *A data conversion interface, comprising:*

*a clock signal generator generating a clock signal in response to a mode signal, said mode signal indicating operation in one of at least a first and second data length transfer mode, wherein at least one of the data lengths is 8 bits; and*

*a parallel-to-serial converter receiving the clock signal, the mode signal, and parallel data and converting the parallel data into serial data having a data length as set forth in the mode signal.*

* * * * *

(12) EX PARTE REEXAMINATION CERTIFICATE (9383rd)
United States Patent
Yang

(10) Number: US 6,252,527 C2
(45) Certificate Issued: Oct. 26, 2012

(54) INTERFACE UNIT FOR SERIAL-TO-PARALLEL CONVERSION AND/OR PARALLEL-TO-SERIAL CONVERSION

(75) Inventor: Yil-Suk Yang, Pohang (KR)

(73) Assignee: Intellectual Ventures II LLC, Wilmington, DE (US)

Reexamination Request:
No. 90/012,274, Apr. 27, 2012

Reexamination Certificate for:
Patent No.: 6,252,527
Issued: Jun. 26, 2001
Appl. No.: 09/200,935
Filed: Nov. 30, 1998

Reexamination Certificate C1 6,252,527 issued Mar. 27, 2012

(30) Foreign Application Priority Data

Jun. 3, 1998 (KR) ...................................... 98/20619

(51) Int. Cl.
*H03M 9/00* (2006.01)
(52) U.S. Cl. ........................................ 341/100; 341/101
(58) Field of Classification Search .................... None
See application file for complete search history.

(56) References Cited

To view the complete listing of prior art documents cited during the proceeding for Reexamination Control Number 90/012,274, please refer to the USPTO's public Patent Application Information Retrieval (PAIR) system under the Display References tab.

*Primary Examiner* — My-Trang Nu Ton

(57) ABSTRACT

A serial communication interface is provided in which the data length operating mode is selectable. Based on the selected data length operating mode, serial-to-parallel and/or parallel-to-serial conversion takes place in data blocks of the selected data length.

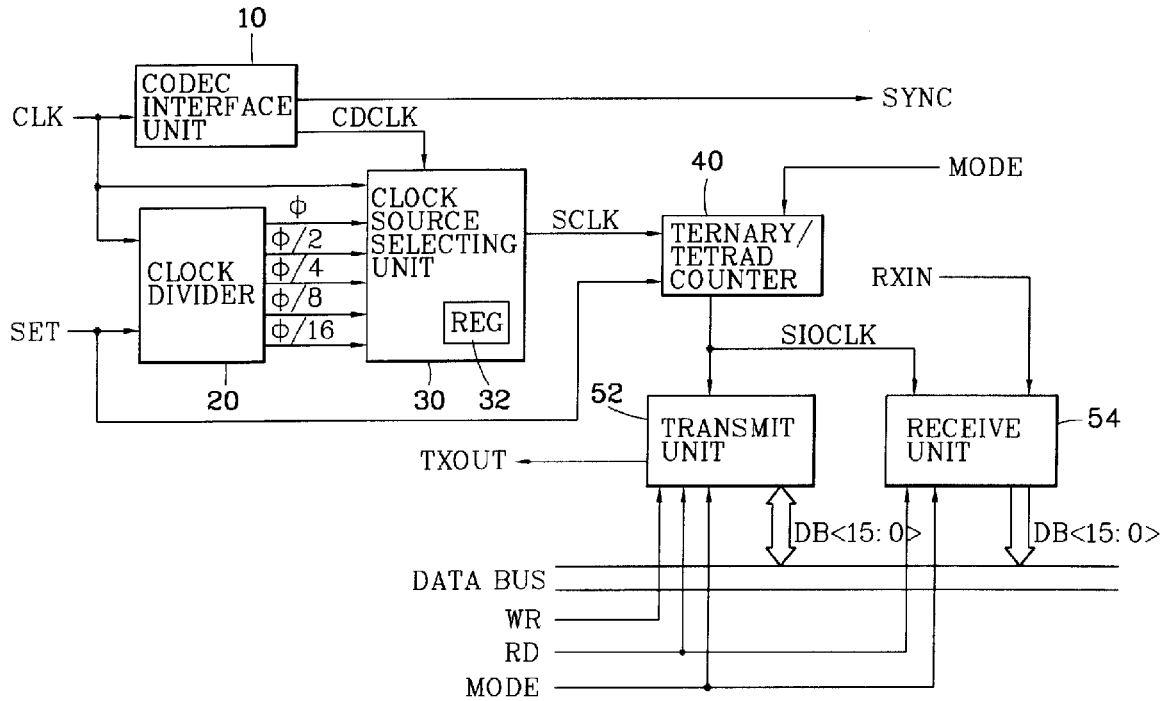

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-16 and 18-37 is confirmed.

Claim 17 was previously cancelled.

\* \* \* \* \*